United States Patent
Rajendran et al.

(10) Patent No.: US 9,722,536 B2
(45) Date of Patent: Aug. 1, 2017

(54) DIGITAL CONTROLLED OSCILLATOR AND SWITCHABLE VARACTOR FOR HIGH FREQUENCY LOW NOISE OPERATION

(71) Applicant: Texas Instruments Incorporated, Dallas, TX (US)

(72) Inventors: Gireesh Rajendran, C V RamanNagar (IN); Rakesh Kumar, Uttar Pradesh (IN); Subhashish Mukherjee, Bangalore (IN); Ashish Lachhwani, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/518,001

(22) Filed: Oct. 20, 2014

(65) Prior Publication Data

US 2016/0112006 A1    Apr. 21, 2016

(51) Int. Cl.
*H03B 5/12*    (2006.01)

(52) U.S. Cl.
CPC ......... *H03B 5/1212* (2013.01); *H03B 5/1228* (2013.01); *H03B 5/1265* (2013.01)

(58) Field of Classification Search
CPC . H03B 5/08; H03B 5/12; H03B 5/124; H03B 5/1243; H03B 5/1246; H03B 5/1253
USPC ............................... 331/117 FE, 117 R, 167
See application file for complete search history.

(56) References Cited

U.S. PATENT DOCUMENTS

| | | | |
|---|---|---|---|
| 7,084,713 B2 * | 8/2006 | Peluso | H03B 5/1228 331/179 |
| 7,714,665 B2 | 5/2010 | Waheed et al. | |
| 8,121,558 B2 | 2/2012 | Rajendran et al. | |
| 8,143,955 B2 | 3/2012 | Rajendran et al. | |
| 8,345,811 B2 | 1/2013 | Gunturi et al. | |
| 2003/0107442 A1 | 6/2003 | Staszewski | |
| 2005/0068086 A1 * | 3/2005 | Yeh | H03K 3/013 327/337 |
| 2009/0201088 A1 | 8/2009 | Sivadas et al. | |
| 2009/0252269 A1 | 10/2009 | Gunturi | |
| 2009/0280752 A1 | 11/2009 | Rajendran et al. | |
| 2010/0075620 A1 | 3/2010 | Subburaj et al. | |
| 2011/0039511 A1 | 2/2011 | Rajendran et al. | |
| 2011/0187463 A1 | 8/2011 | Rajendran et al. | |
| 2013/0093477 A1 | 4/2013 | Rajendran | |

* cited by examiner

*Primary Examiner* — Jeffrey Shin
(74) *Attorney, Agent, or Firm* — Gregory J. Albin; Charles A. Brill; Frank D. Cimino

(57) ABSTRACT

Low noise switchable varactors and digital controlled oscillator (DCO) circuitry are presented for creating alternating signals at controlled frequencies, including a first transistor for selectively coupling two capacitors between varactor output nodes when a control signal is in a first state, second and third transistors for selectively coupling first and second internal nodes between the respective capacitors and the first transistor with a third internal node when the control signal is in the first state, and an inverter disconnected from the first and second internal nodes to mitigate phase noise and operable to control the voltage of the third internal node according to the control signal.

16 Claims, 5 Drawing Sheets

US 9,722,536 B2

DIGITAL CONTROLLED OSCILLATOR AND SWITCHABLE VARACTOR FOR HIGH FREQUENCY LOW NOISE OPERATION

BACKGROUND

Digital controlled oscillator (DCO) circuits are used in a variety of applications such as phase locked loop (PLL) circuits to create alternating signals at a controlled frequency. Cross-coupled L-C oscillator circuits employ a tank circuit formed of an inductance and a parallel capacitance with a cross-coupled transistor pair to provide a differential alternating signal at a frequency controlled by adjusting the value of the tank circuit capacitance. DCO circuits provide an array of parallel-connected capacitor banks or cells with the ability to activate or deactivate individual cells to adjust the overall capacitance thereby providing frequency adjustment or tuning capability. Conventional DCO capacitor cells include circuitry to selectively connect two capacitances in parallel with the oscillator inductor to turn the cell "on", with pull up transistor circuitry to help bias the floating terminals of the cell capacitors when the cell is turned "off". At high frequency operation, however, drain-source resistive/capacitive impedances of PMOS pull up transistors in such conventional capacitor cells become more pronounced during the cell "off" state, whereby the phase noise is increased as the tank circuit impedance becomes more resistive. Accordingly, a need remains for improved DCO switchable capacitance circuitry for providing an alternating signal at a controlled adjustable frequency while mitigating phase noise.

SUMMARY

Presently disclosed embodiments provide DCO circuits and switchable capacitance or varactor circuits therefor including a first capacitance coupled between a first varactor output node and a first internal node, a second capacitance coupled between a second varactor output node and a second internal node, as well as a first transistor for selectively coupling the first and second capacitances when a control signal is in a first state. In addition, a second transistor selectively couples the first internal node with a third internal node and a third transistor selectively couples the second internal node with the third internal node when the control signal is in the first state. A fourth transistor is provided to selectively couple the third internal node with a supply voltage to help maintain the second and third transistors off when the control signal is in a different second state to turn the varactor off. In certain embodiments, the fourth transistor is not connected to the first or second capacitances and thus its high-frequency impedance does not impact the off-state oscillator phase noise as was the case in conventional switchable capacitor cells. A fifth transistor is provided in certain embodiments, forming an inverter with the fourth transistor to selectively couple the third internal node with a ground connection or other constant voltage node at a voltage less than the supply voltage when the control signal is in the first state. When the first, second and third transistor gate voltage is in the low state, any voltage swing at the first and second internal nodes that is high enough to turn-on the second and third transistor will shift the voltage level at these internal nodes (first and second) by acting like a half wave rectifier tracking the peak swing. This will continue till the second and third transistor turns off completely. By keeping the device type of the first transistor the same as second and third, a complete turn-off of the first transistor is also ensured by this scheme. Further aspects of the disclosure provide an oscillator circuit including an inductance and one or more switchable capacitance circuits or switchable varactors as described supra, with a cross-coupled transistor pair circuit coupled in parallel with the inductance and the switchable varactor circuitry, this forms a positive feedback system that can oscillate at a frequency set by the value of the inductor and capacitance formed across the inductor.

DESCRIPTION OF THE VIEWS OF THE DRAWINGS

The following description and drawings set forth certain illustrative implementations in detail, which are indicative of several ways in which the various principles of the disclosure may be carried out. The illustrated examples, however, are not exhaustive of the many possible embodiments of the disclosure. Other objects, advantages and novel features of the disclosure will be set forth in the following detailed description when considered in conjunction with the drawings, in which:

FIG. 5 is a simplified partial side elevation view illustrating a PMOS transistor in the conventional switchable capacitor cell circuits of FIGS. 3 and 4 showing source-drain parasitic resistor-capacitor impedances when the PMOS transistor is on.

DETAILED DESCRIPTION

Figure 1:
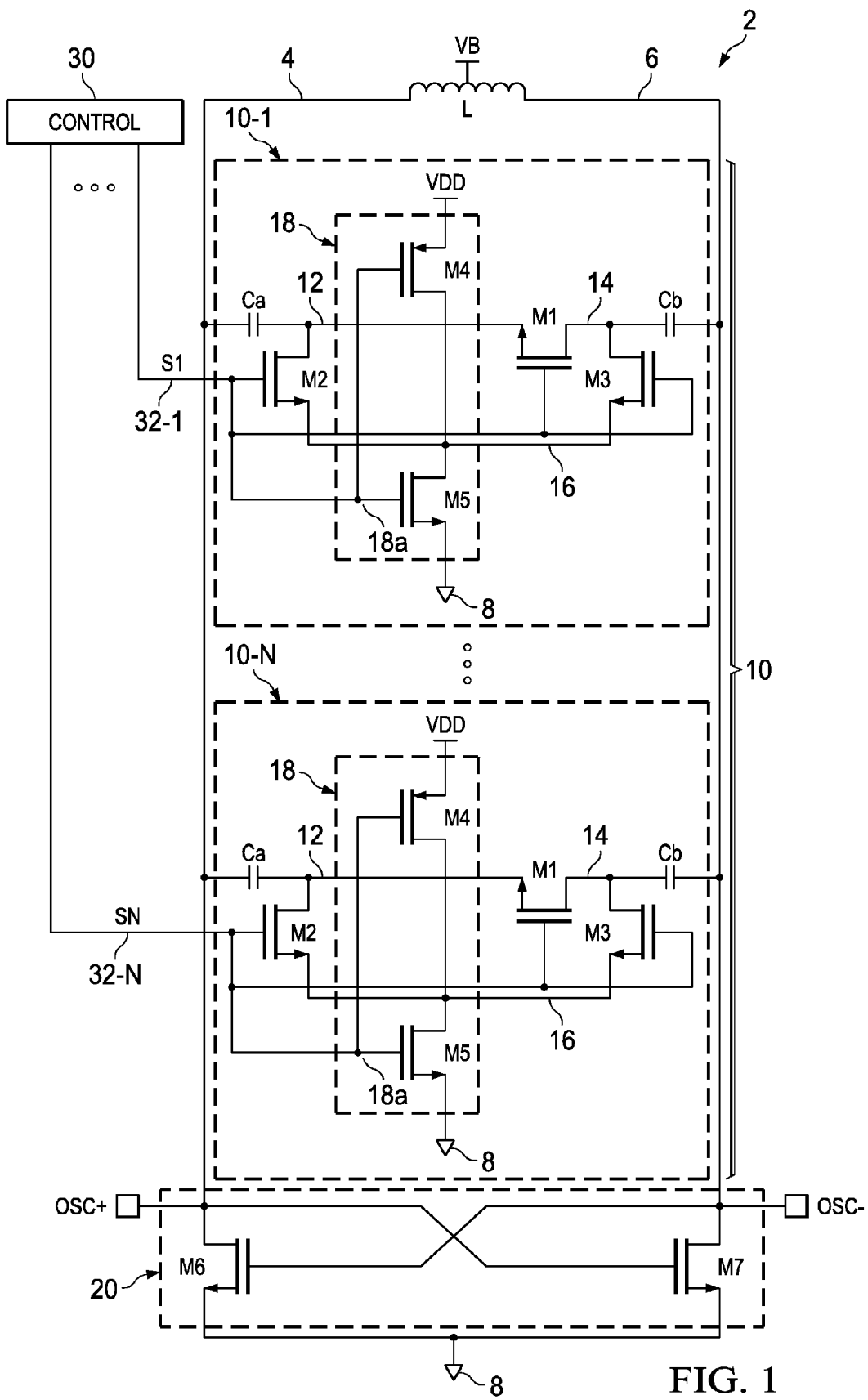
FIG. 1 is a schematic diagram illustrating a digital controlled oscillator circuit embodiment with multiple switchable capacitor cells in parallel having an inductor and a cross-coupled transistor pair for generating an alternating differential signal at a controlled frequency.

One or more embodiments or implementations are hereinafter described in conjunction with the drawings, wherein like reference numerals are used to refer to like elements throughout, and wherein the various features are not necessarily drawn to scale.

FIG. 1 illustrates a DCO circuit 2 operative to generate an alternating differential signal at first and second oscillator output nodes 4 and 6 (OSC+ and OSC−), respectively, with an inductance L connected between the oscillator output nodes 4 and 6 and coupled with a positive bias voltage VB as shown. An integer number N switchable capacitance circuits or switchable varactor circuits 10-1 through 10-N are coupled in parallel with the inductance L between the first and second oscillator output nodes 4 and 6 to form an L-C tank circuit, with a cross-coupled transistor pair circuit 20 including NMOS transistors M6 and M7 coupled in parallel with the tank circuit. Any number N varactor circuits 10 can be used, where N is a positive integer. In operation, the circuit 2 oscillates at a controlled frequency set according to the inductance of the inductor L and an adjustable capacitance established by selective activation or deactivation of individual varactor circuits 10 under control of a control circuit 30. The cross-coupled connection of the transistors M6 and M7 provides for alternating operation with M6 being turned on to couple the first oscillator output node 4 with a constant voltage node 8, in this case a circuit ground, when the OSC− voltage at the second oscillator output node 6 is high. Thereafter M7 is turned on when the OSC+ voltage at the first oscillator output node 4 is high to couple the second oscillator output node 6 to the ground node 8. The example embodiment thus forms a positive feedback system that can oscillate at a frequency set by the value of the inductor L and the switchable capacitance formed across the inductor. Other circuit implementations are possible using a different cross-section coupled transistor pair circuit 20, for example, with PMOS transistors connected between the tank circuit and a positive supply voltage to alternately connect one of the nodes 4, 6 with the supply voltage while disconnecting the other of the oscillator output nodes 4, 6 from the supply voltage, where a negative bias voltage VB can be used.

The operating frequency of the oscillator circuit 2 can be tuned or adjusted by the selective provision of the control signals S at a corresponding output node 32-1, 32-N (hereinafter output nodes 32) from the control circuit 30, where a single varactor circuit 10 may be used, with the control circuit 30 providing a corresponding control signal S having one of two possible states for two different capacitance values in the tank circuit. Other embodiments are possible, for example, having two or more varactor circuits 10 as shown in FIG. 1, with each circuit 10 providing first and second capacitance values between the nodes 4 and 6 based on the state of the corresponding switching control signal S from the control circuit 30. In this regard, the individual varactor circuits 10 are each operable in one of two states, including an "on" state (e.g., with the corresponding switching control signal S being in a first or high state) with the corresponding capacitances Ca and Cb being connected in series with one another between the nodes 4 and 6 to provide a first capacitance level, and with the oscillator output nodes 4 and 6 corresponding to first and second varactor output nodes for each of the varactor circuits 10. The individual varactor circuits 10, moreover, are further operable in a second or "off" state (S being in a second low state) with the varactor circuit switches operating to disconnect the capacitances Ca and Cb from one another. In this "off" state, a given varactor circuit 10 provides a second (lower) amount of capacitance between the nodes 4 and 6. In particular, leakage capacitances in the individual circuits 10 will effectively provide a non-zero capacitance between the nodes 4 and 6 even when the varactor circuit 10 is in the off state.

The control circuit 30 includes control output nodes 32-1 through 32-N providing switching control signals (select signals S1 through SN) to the corresponding varactor circuits 10-1 through 10-N for selective adjustment or tuning of the amount of capacitance in the tank circuit formed with the inductor L, and hence the control circuit 30 provides adjustment of the controlled frequency during operation of the DCO circuit 2. In this regard, the oscillator frequency is a function of the square root of the product of the inductance of inductor L and the capacitance provided by the parallel connection of the varactor circuits 10 and their respective on or off state capacitances. In certain implementations, the on-state capacitances of the varactor circuits 10 may be equal. In other possible embodiments, the on-state capacitances are different, for example, binary weighted. In general, the capacitance values of the circuits 10 in the "on" state need not be equal. However, it is generally desirable to provide multiple varactor circuits 10 in order to allow adjustment of the operating frequency of the oscillator circuit 2 for tuning, frequency hopping, or other functions, and increasing the number of varactors 10 (e.g., higher value for N) facilitates adjustment over a wider range and/or finer granularity in setting the operating frequency.

It is further noted that operation at or near a high end of a operating frequency range for a given multi-cell DCO circuit 2 means that many, if not all, the varactor circuits 10 will be in the "off" state, thereby providing a smaller tank circuit capacitance value, and thus a higher operating frequency. Unlike conventional varactor circuits used in DCOs (e.g., FIGS. 3-5 below), however, the operation with many or all the varactor circuits 10-1 through 10-N of FIG. 1 in the off state (low capacitance) for high-frequency operation of the oscillator 2 advantageously provides for off state operation without significant degradation of phase loss and other noise characteristics. Thus, the varactor circuitry 10 and DCO circuit 2 of the present disclosure advantageously facilitate high frequency, low noise operation without increasing cost or circuit space compared with conventional solutions.

As best shown in FIG. 1, the illustrated varactor circuits 10 each include first and second varactor input nodes 4 and 6, respectively, as well as a first capacitance Ca coupled (e.g., connected) between the first input node 4 and a first internal node 12, and a second capacitance Cb coupled between the second varactor input node 6 and a second internal node 14. The individual capacitances Ca and Cb can be any suitable capacitor structure or multiple capacitor structures connected in any suitable series, parallel and/or series/parallel configurations, such as MOS capacitors formed in an integrated circuit. The varactor circuits 10 further include a first transistor M1, an NMOS transistor in one example, coupled between the first and second internal nodes 12 and 14. The gate control terminal of M1 is coupled with the control terminal 32 for receiving the corresponding switching control signal S from the control circuit 30, where M1 is turned on (e.g., low source-drain impedance between the internal nodes 12 and 14) when the control signal S is in a first (high) state to provide a positive gate-source voltage to M1 The varactor circuits 10 also include second and third transistors M2 and M3 (e.g., NMOS transistors in one non-limiting embodiment), each having gate control terminals coupled to receive the switching control signal S from the control output node 32. A drain of M2 is coupled with the first internal node 12 and the drain of M3 is coupled with the second internal node 14, and the source terminals of M2 and M3 are coupled with a third internal node 16 as shown. Thus, when the switching control signal S is high, M2 and M3 are also on, thereby coupling the internal nodes 12 and 13 to the voltage at the third internal node 16.

The circuit 10 further includes an inverter 18 formed by a fourth transistor M4 a fifth transistor M5, with control terminals of M4 and M5 connected to one another at an inverter input node 18a coupled with the control output node 32 from the control circuit 30. The drains of M4 and M5 are coupled with the third internal node 16 to form an inverter output. In the illustrated embodiment, the fifth transistor M5 is an NMOS transistor with a drain coupled with the third internal node 16, a source coupled with the constant voltage (e.g., ground) node 8, and a gate control terminal coupled with the control output node 32 to receive the switching control signal S. When the control signal S is high (varactor "on" state), M5 is on to couple the third internal node 16 with the constant voltage node 8, while M4 (e.g., PMOS in this example) is turned off. Because M2 and M3 are also turned on when S is high, the first and second internal nodes 12 and 14 are effectively coupled to ground or other constant voltage potential of the node 8. In this manner, each of the capacitances Ca and Cb are coupled between the corresponding varactor output node (e.g., oscillator output node) 4, 6 and the constant potential node 8 when the varactor circuit 10 is in the on state, thereby providing a first amount of capacitance in parallel with the tank circuit inductor L to set the operating frequency of the oscillator circuit 2.

When S is low (e.g., below the gate-source threshold voltage of M1), the drain-source impedance of M1 goes high (M1 off), whereby the capacitances Ca and Cb are no longer coupled with one another. In addition, M2, M3 and M5 are turned off when S is low. In this off state, the internal nodes 12 and 14 are ideally "floating", and thereby the varactor circuit 10 provides a second, much lower capacitance to the tank circuit. However, the inventor has appreciated that the floating internal nodes 12 and 14 (in the cell off state) will tend to be at a voltage that oscillates due to the connection of the outer terminals of the corresponding capacitances Ca and Cb with the corresponding oscillator output nodes 4 and 6, respectively. In this regard, should either of the internal nodes 12 and/or 14 reach a sufficiently negative voltage, one or more of the transistors M1-M3 may turn on, thereby adversely affecting the tank circuit impedance and operation of the oscillator circuit 2. Accordingly, the transistor M4 is turned on when S is low, and the coupling of the source of M4 to a positive supply voltage VDD (a higher voltage than that of the constant voltage node 8) pulls the third internal node 16 high, thereby ensuring that the gate-source voltage between the control signal output node 32 and the third internal node 16 will not exceed the threshold voltages of M2 and M3, whereby these transistors will remain off in the varactor off state when S is low.

Figure 2:
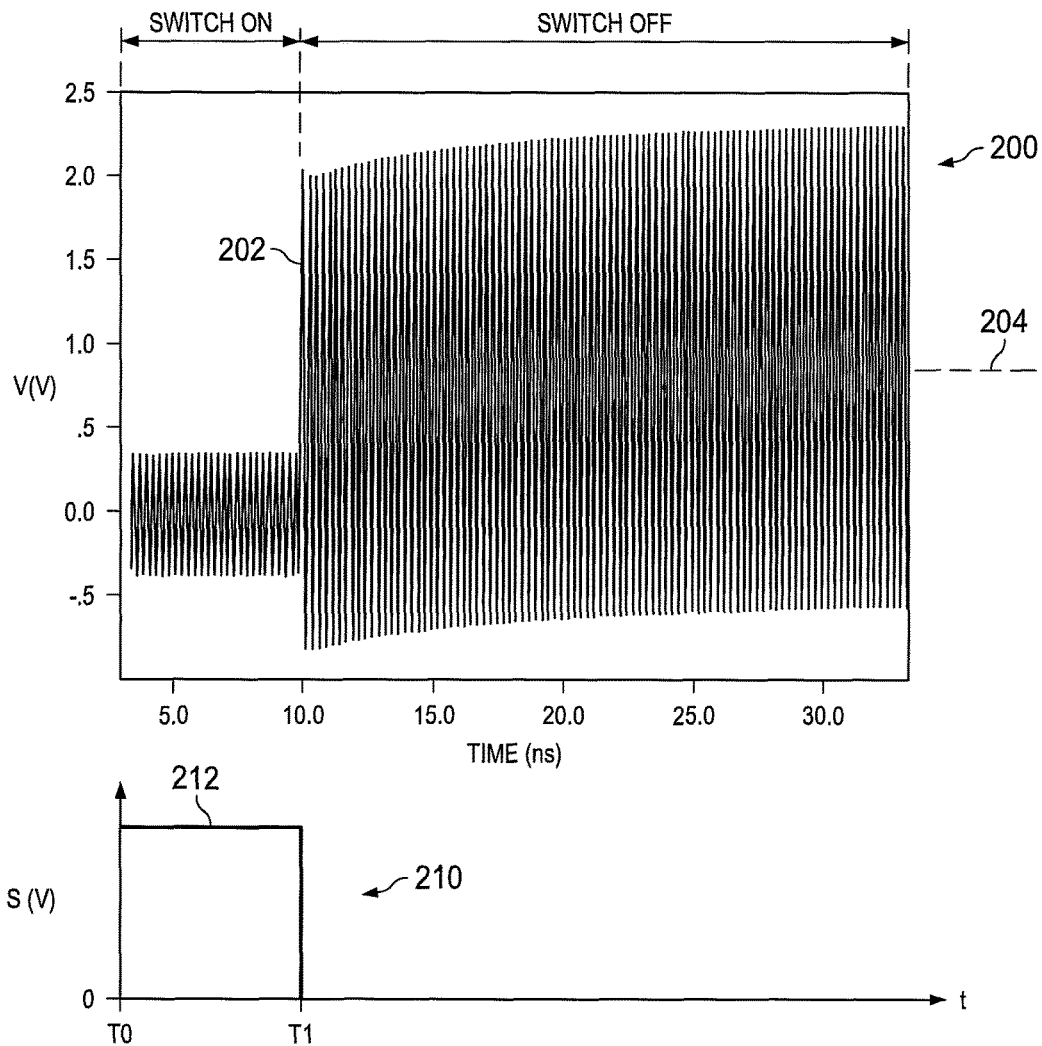
FIG. 2 is a graph showing an internal node signal waveform for varactor on and off states in the DCO circuit of FIG. 1.

Referring also to FIG. 2, the coupling of the sources of M2 and M3 to VDD through M4 also ensures that the voltages at the internal nodes 12 and 14 will not go sufficiently negative to turn on M1, since slight drain-source conduction of M2 and M3 will tend to connect the internal nodes 12 and 14 with VDD, thus counteracting any negative swings in the voltages at the ideally floating nodes 12 and 14. In this manner, the voltage at the source of M1 (e.g., node 12) is inhibited from going low enough to turn on M1, whereby the capacitances Ca and Cb remain disconnected from the tank circuit when S is low. The graph 200 in FIG. 2 illustrates an example voltage waveform 202 at the first internal node 12 in the DCO circuit of FIG. 1, and the corresponding graph 210 shows the waveform 212 of the switching control signal S applied to the varactor circuit 10. In this example, the varactor 10 is initially on (S high) from T0 to T1, and then the control circuit 30 turns the varactor off at T1 by bringing S low. When the varactor 10 is on from T0 through T1, M5 is on to ground the third internal node 16, with M2 and M3 setting the bias for the third internal node 16, and hence the nodes 12 and 14 with the capacitances Ca and Cb coupled to one another and to the constant voltage (e.g., ground) node 8 for contributing a controlled first level of capacitance to the tank circuit formed with the inductor L. When the varactor 10 is turned off at T1, the signal swing at the source and drain of M1 (at nodes 12 and 14) will charge the node voltages until there is no conduction through M2 and M3 to ground 8, with the nodes 12 and 14 reaching a steady state DC voltage value 204, with the oscillator operation providing alternating swings above and below this level at the operating frequency. When the signal S is low, any voltage swing at the first and second internal nodes 12 and 14 that is high enough to turn-on the second and/or third transistors M2, M3 will shift the voltage level at the nodes 12 and 14 by acting like a half wave rectifier tracking the peak swing. This will continue till the second and third transistors M2 and M3 turn off completely. By keeping the device type of the first transistor M1 the same as that or M2 and M3, a complete turn-off of the first transistor M1 is thus also ensured by the example embodiment.

The varactor circuits 10 of FIG. 1, moreover, advantageously provide no noise contribution from the biasing transistors M4 and M5 of the inverter 18 during the cell off state, and thus facilitate high oscillator tank circuit "Q" since there are no on switches coupled with the capacitances Ca and Cb when S is low. Moreover, substantially no noise is contributed by the biasing PMOS transistor M4 of the inverter 18, which shows up as a common mode element, and M4 is disconnected from the internal nodes 12, 14 and hence from the capacitances Ca and Cb. Thus, the illustrated varactor circuits 10 advantageously mitigate adverse phase noise effects and operation of the oscillator 2, even at high-frequency operation with many or all of the varactor circuits 10 in the "off" state. In particular, the only transistor which is "on" in the varactor off state (when S is low) is the PMOS transistor M4. Importantly, this transistor is disconnected from the floating nodes 12 and 14, and hence is disconnected from the capacitances Ca and Cb when the varactor 10 is off. Accordingly, the resistive/capacitive drain-source impedance of M4 does not play a significant role (if any) in the tank circuit impedance, and thus does not adversely impact the phase noise, quality Q or other noise characteristics of the DCO circuit 2.

Figure 3:
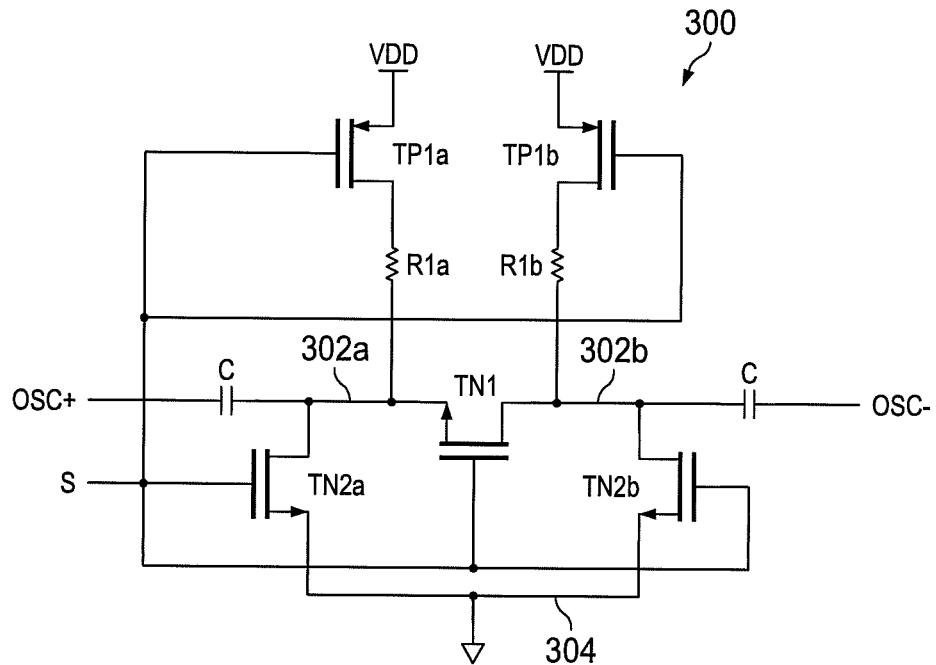
FIG. 3 is a schematic diagram illustrating a conventional switchable capacitor cell circuit.
Figure 4:
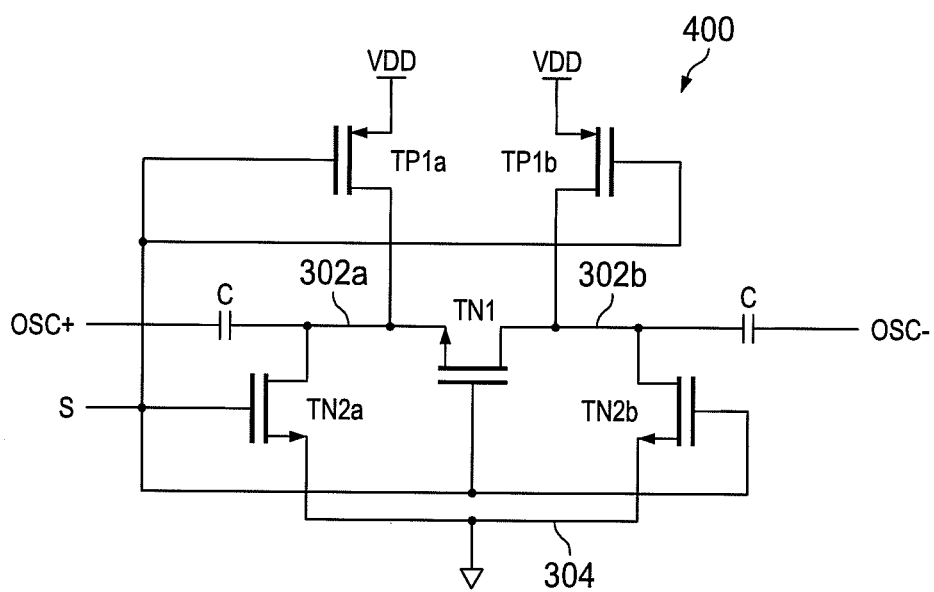
FIG. 4 is a schematic diagram illustrating another conventional switchable capacitor cell circuit.
Figure 5:
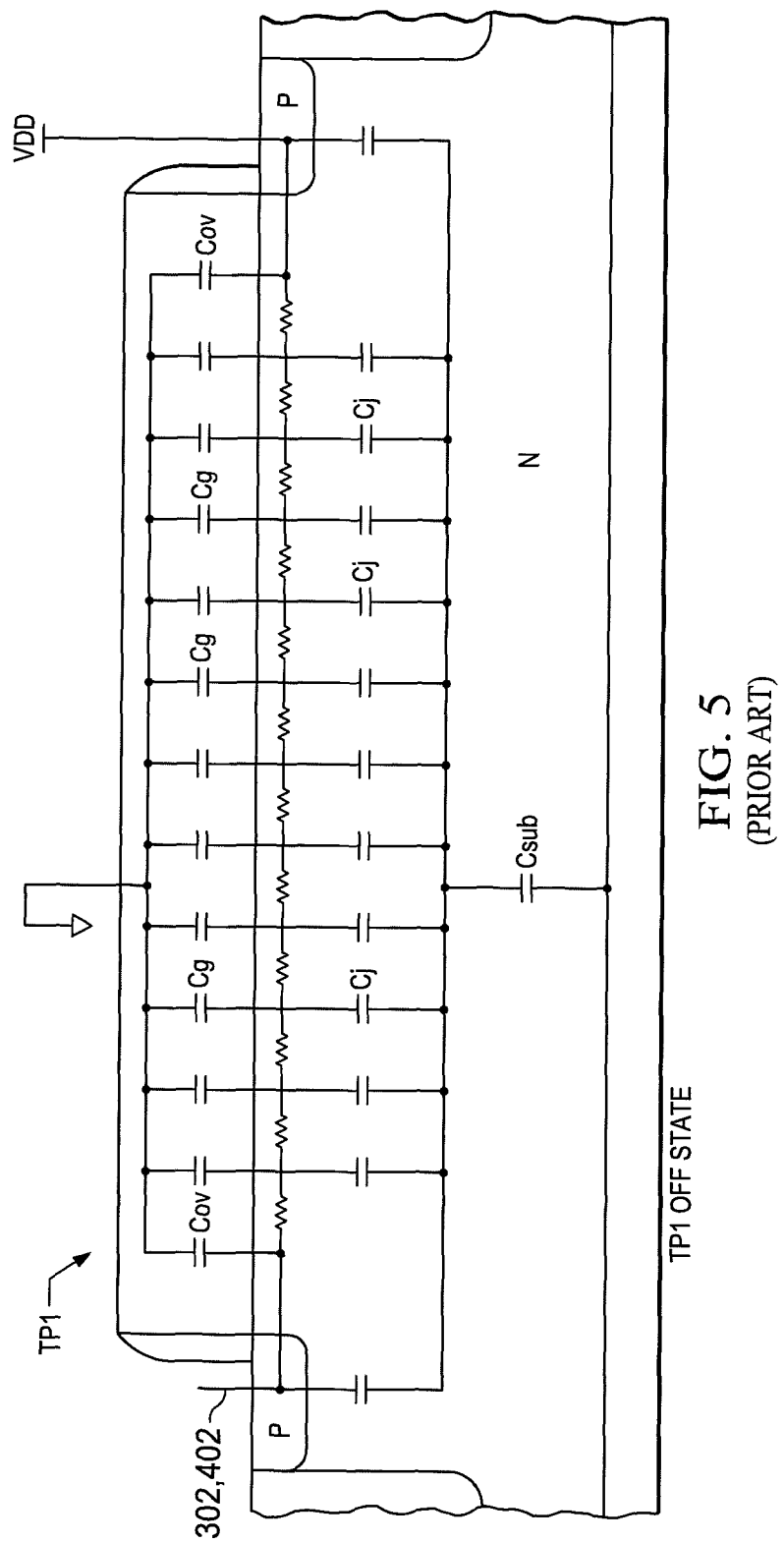

Referring now to FIGS. 3-5, this is in stark contrast to conventional varactor circuits as discussed further below. FIG. 3 shows a conventional switchable capacitor cell circuit 300 with a center transistor TN1 having source and drain terminals connected to internal nodes 302a and 302b, with capacitors C connected between the transistor TN1 and oscillator output nodes OSC+ and OSC−. The transistor TN1 is connected to receive a switching control signal S, and on-state biasing transistors TN2a and TN2b are on when the control signal S is high to connect the nodes 302 to a ground node 304. In this conventional circuit, the on resistance (e.g., $R_{DSON}$) of transistor TN1 sets the Q of the varactor 300 in the on mode in which the capacitors C contribute to the overall capacitance of the oscillator circuit (the remainder of the oscillator circuit is not shown in FIGS. 3 and 4). The circuit 300 further includes off-state biasing PMOS transistors TP1a and TP1b coupled through corresponding resistors R1a and R1b to the internal nodes 302a and 302b, respectively. When the control signal S is low, the biasing transistors TP1 are turned on to pull up the internal nodes 302 to a supply voltage VDD through the R1 resistors, where the on-state drain-source impedances ($R_{DSON}$) of the biasing transistors TP1 and the resistors R1 (TN2 and R1/(R1+TP1)) sets the bias point of the internal node 302. FIG. 4 illustrates another conventional switchable capacitor cell circuit 400 in which the off-state biasing (when S is low) is set by the on-state impedance of the transistors TP1, with the resistors R1 of FIG. 3 removed in FIG. 4.

The inventors have appreciated that parasitic capacitance of TN1, TN2 and R1 in the on state (or TP1 in the off state) along with parasitic bottom plate capacitance of these transistors sets the On/Off ratio of the conventional varactor 300, 400, wherein the impedance of R1 at oscillation frequency divided by the on resistance of TP1 sets the Loss/Q in off mode (Low C mode). As further shown in FIG. 5, moreover, the impedance of R1, typically implemented on-chip, divided by the on state impedance of TP1, may not be high enough for high frequency applications due to the distributed R/C nature of the PMOS transistors TP1. FIG. 5 illustrates the off-state biasing transistor TP1 with the gate terminal coupled to ground (S is low in the off state), along with the source coupled to VDD and the drain coupled with the internal node 302. When TP1 is thus turned on by a low signal S, the internal node 302 is coupled through a distributed RC network to VDD through the channel of TP1, including resistors as shown as well as gate capacitances Cg, overlap capacitances Cov at the edges of the gate structure, junction capacitances Cj and a substrate capacitance Csub. Thus, the pull-up impedance of TP1 (and any included resistor R1 as in FIG. 3) is relatively low during high frequency operation due to the distributed R/C impedance of TP1. As a result, the Q of the resulting oscillator tank circuit is limited, and the phase noise is degraded. Moreover, depending on the amount of voltage swing at the internal nodes 302, TN2 may turn on for a short duration even though S is low, and this results in a changing impedance, in turn causing a DC current flow through the bias section (through TP1) which degrades the noise performance.

Figure 6:
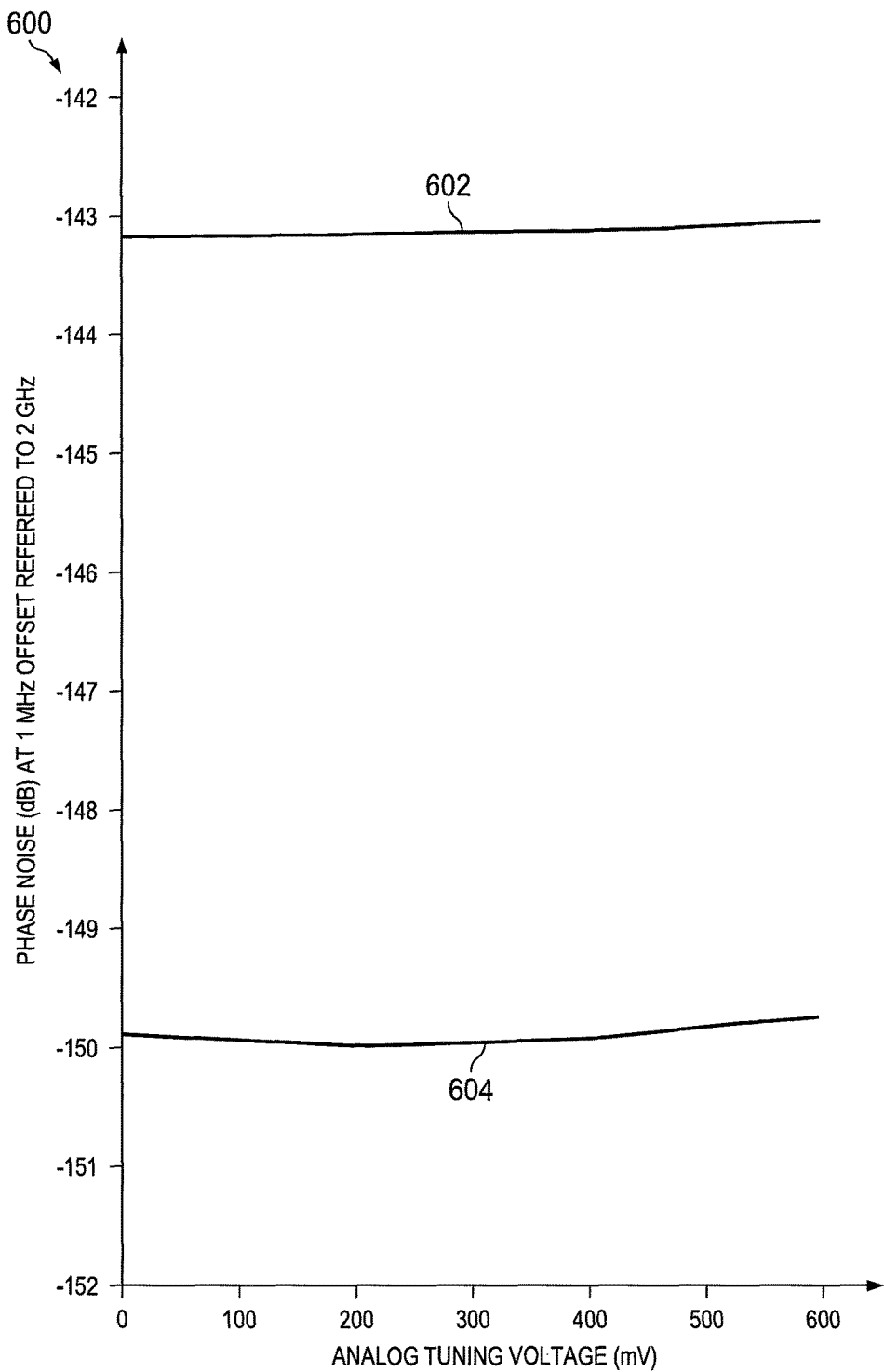
FIG. 6 is a graph illustrating phase noise curves as a function of analog tuning voltage for the DCOs of FIGS. 1 and 3.

Referring also to FIG. 6, a graph 600 illustrates phase noise (dB) at 1 MHz offset referred to 2 GHz, showing a first curve 602 representing the phase noise in a DCO with all varactors 300, 400 turned off. The curve 602 thus illustrates the significant phase noise contribution from the biasing transistors TP1 in the conventional implementations of FIGS. 3 and 4 as a function of the analog tuning voltage for a DCO having a frequency range F Max/F Min=1.15 when the varactor circuits are off (TP1 on). The graph 600 further shows a curve 604 illustrating the corresponding phase noise in a DCO 2 as shown in FIG. 1 using the improved varactor circuits 10 of the present disclosure, resulting in a significant decrease in the phase noise degradation.

The above examples are merely illustrative of several possible embodiments of various aspects of the present disclosure, wherein equivalent alterations and/or modifications will occur to others skilled in the art upon reading and understanding this specification and the annexed drawings. In addition, although a particular feature of the disclosure may have been disclosed with respect to only one of multiple implementations, such feature may be combined with one or more other features of other embodiments as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

What is claimed is:

1. A digital controlled oscillator (DCO) circuit for generating an alternating differential signal at a controlled frequency, comprising:
   an inductance coupled between first and second oscillator output nodes;
   a switchable capacitance circuit coupled in parallel with the inductance between the first and second oscillator output nodes, the switchable capacitance circuit including at least one capacitor cell, the at least one capacitor cell comprising:
      a control input terminal for receiving a switching control input signal having a first state to turn the at least one capacitor cell on to provide a first capacitance between the first and second oscillator output nodes, and a second state to turn the at least one capacitor cell off to provide a second lower capacitance between the first and second oscillator output nodes,
      a first capacitance including a first terminal coupled with the first oscillator output node, and a second terminal coupled with a first internal node,
      a second capacitance including a first terminal coupled with the second oscillator output node, and a second terminal coupled with a second internal node,
      a first transistor including a source terminal coupled with the first internal node, a drain terminal coupled with the second internal node, and a gate terminal coupled with the control input terminal to turn the first transistor on when the switching control input signal is in the first state and to turn the first transistor off when the switching control signal is in the second state,
      a second transistor including a drain terminal coupled with the first internal node, a source terminal coupled with a third internal node, and a gate terminal coupled with the control input terminal to turn the second transistor on when the switching control input signal is in the first state and to turn the second transistor off when the switching control signal is in the second state,
      a third transistor including a drain terminal coupled with the second internal node, a source terminal coupled with the third internal node, and a gate terminal coupled with the control input terminal to turn the third transistor on when the switching control input signal is in the first state and to turn the third transistor off when the switching control signal is in the second state, and
      an inverter circuit with an inverter input node coupled with the control input terminal, and an inverter output node controlling a voltage at the third internal node according to the switching control input signal; and
   a cross-coupled transistor pair circuit coupled in parallel with the inductance and the switchable capacitance circuit.

2. The DCO circuit of claim 1, wherein the inverter circuit comprises:
   a fourth transistor including a source terminal coupled with a positive supply voltage, a drain terminal coupled with the third internal node, and a gate terminal coupled with the inverter input node to turn the fourth transistor off when the switching control input signal is in the first state and to turn the fourth transistor on when the switching control signal is in the second state; and
   a fifth transistor including a drain coupled with the third internal node, a source terminal coupled with a constant voltage node, and a gate terminal coupled with the inverter input node to turn the fifth transistor on when the switching control input signal is in the first state and to turn the fifth transistor off when the switching control signal is in the second state.

3. The DCO circuit of claim 2, wherein the fourth transistor is a PMOS transistor, and the fifth transistor is an NMOS transistor.

4. The DCO circuit of claim 3, wherein the first, second and third transistors are NMOS transistors.

5. The DCO circuit of claim 2, wherein the cross-coupled transistor pair circuit comprises:
   a sixth transistor including a drain terminal coupled with the first oscillator output node, a source terminal coupled with the constant voltage node, and a gate terminal coupled with the second oscillator output node; and a seventh transistor including a drain terminal coupled with the second oscillator output node, a source terminal coupled with the constant voltage node, and a gate terminal coupled with the first oscillator output node;

wherein the sixth and seventh transistors are NMOS transistors.

6. The DCO circuit of claim 1, wherein the first, second and third transistors are NMOS transistors.

7. The DCO circuit of claim 6, wherein the cross-coupled transistor pair circuit comprises:

a sixth transistor including a drain terminal coupled with the first oscillator output node, a source terminal coupled with a constant voltage node, and a gate terminal coupled with the second oscillator output node; and a seventh transistor including a drain terminal coupled with the second oscillator output node, a source terminal coupled with the constant voltage node, and a gate terminal coupled with the first oscillator output node;

wherein the sixth and seventh transistors are NMOS transistors.

8. The DCO circuit of claim 1, wherein the cross-coupled transistor pair circuit comprises:

a sixth transistor including a drain terminal coupled with the first oscillator output node, a source terminal coupled with a constant voltage node, and a gate terminal coupled with the second oscillator output node; and a seventh transistor including a drain terminal coupled with the second oscillator output node, a source terminal coupled with the constant voltage node, and a gate terminal coupled with the first oscillator output node;

wherein the sixth and seventh transistors are NMOS transistors.

9. The DCO circuit of claim 1, the switchable capacitance circuit comprising a plurality of capacitor cells coupled in parallel with the inductance between the first and second oscillator output nodes, the individual capacitor cells comprising:

a control input terminal for receiving a switching control input signal having a first state to turn the at least one capacitor cell on to provide a first capacitance between the first and second oscillator output nodes, and a second state to turn the at least one capacitor cell off to provide a second lower capacitance between the first and second oscillator output nodes;

a first capacitance including a first terminal coupled with the first oscillator output node, and a second terminal coupled with a first internal node;

a second capacitance including a first terminal coupled with the second oscillator output node, and a second terminal coupled with a second internal node;

a first transistor including a source terminal coupled with the first internal node, a drain terminal coupled with the second internal node, and a gate terminal coupled with the control input terminal to turn the first transistor on when the switching control input signal is in the first state and to turn the first transistor off when the switching control signal is in the second state;

a second transistor including a drain terminal coupled with the first internal node, a source terminal coupled with a third internal node, and a gate terminal coupled with the control input terminal to turn the second transistor on when the switching control input signal is in the first state and to turn the second transistor off when the switching control signal is in the second state;

a third transistor including a drain terminal coupled with the second internal node, a source terminal coupled with the third internal node, and a gate terminal coupled with the control input terminal to turn the third transistor on when the switching control input signal is in the first state and to turn the third transistor off when the switching control signal is in the second state; and an inverter circuit with an inverter input node coupled with the control input terminal, and an inverter output node controlling a voltage at the third internal node according to the switching control input signal.

10. A switchable varactor circuit for providing a switchable capacitance between first and second varactor nodes, the switchable varactor circuit comprising:

a first capacitance coupled between the first varactor node and a first internal node;

a second capacitance coupled between the second varactor node and a second internal node;

a first transistor with a first control terminal for receiving a control signal, the first transistor selectively operable to couple the first internal node with the second internal node to provide a first capacitance between the first and second varactor nodes when the control signal is in a first state, and to decouple the first internal node from the second internal node to provide a second lower capacitance between the first and second varactor nodes when the control signal is in a different second state;

a second transistor with a second control terminal for receiving the control signal, the second transistor selectively operable to couple the first internal node with a third internal node when the control signal is in the first state, and to decouple the first internal node from a third internal node when the control signal is the second state;

a third transistor with a third control terminal for receiving the control signal, the third transistor selectively operable to couple the second internal node with the third internal node when the control signal is in the first state, and to decouple the second internal node from the third internal node when the control signal is the second state;

a fourth transistor with a fourth control terminal for receiving the control signal, the fourth transistor selectively operable to couple the third internal node with a supply voltage node when the control signal is the second state; and a fifth transistor with a fifth control terminal for receiving the control signal, the fifth transistor selectively operable to couple the third internal node with a constant voltage node having a voltage less than the supply voltage when the control signal is the first state.

11. The switchable varactor of claim 10, wherein the first, second, third and fifth transistors are NMOS transistors and the fourth transistor is a PMOS transistor.

12. The switchable varactor of claim 11, wherein the fourth transistor is disconnected from the first and second capacitances.

13. The switchable varactor of claim 10, wherein the fourth transistor is selectively operable to decouple the third internal node from the supply voltage node when the control signal is the first state, and wherein the fifth transistor is selectively operable to decouple the third internal node from the constant voltage node when the control signal is the second state.

14. The switchable varactor of claim 10, wherein the fourth transistor is disconnected from the first and second capacitances.

15. The switchable varactor of claim 10, wherein the fourth transistor is selectively operable to decouple the third internal node from the supply voltage node when the control signal is the first state.

16. A switchable capacitance circuit, comprising:
- a control input for receiving a switching control input signal;
- a first capacitance including a first terminal coupled with a first output node, and a second terminal coupled with a first internal node;
- a second capacitance including a first terminal coupled with a second output node, and a second terminal coupled with a second internal node;
- a first transistor including a source coupled with the first internal node, a drain coupled with the second internal node, and a gate coupled with the control input to turn the first transistor on when the switching control input signal is in the first state and to turn the first transistor off when the switching control signal is in the second state;
- a second transistor including a drain coupled with the first internal node, a source coupled with a third internal node, and a gate coupled with the control input to turn the second transistor on when the switching control input signal is in the first state and to turn the second transistor off when the switching control signal is in the second state;
- a third transistor including a drain coupled with the second internal node, a source coupled with the third internal node, and a gate coupled with the control input to turn the third transistor on when the switching control input signal is in the first state and to turn the third transistor off when the switching control signal is in the second state; and
- an inverter circuit with an inverter input node coupled with the control input, and an inverter output node controlling a voltage at the third internal node according to the switching control input signal.

* * * * *